United States Patent
Kawagoe et al.

(10) Patent No.: US 6,903,976 B2
(45) Date of Patent: Jun. 7, 2005

(54) SEMICONDUCTOR MEMORY DEVICE REDUCED IN POWER CONSUMPTION DURING BURN-IN TEST

(75) Inventors: Tomoya Kawagoe, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 145 days.

(21) Appl. No.: 10/610,762

(22) Filed: Jul. 2, 2003

(65) Prior Publication Data

US 2004/0145953 A1 Jul. 29, 2004

(30) Foreign Application Priority Data

Jan. 24, 2003 (JP) ........................................ 2003-016323

(51) Int. Cl.[7] .............................................. G11C 7/00
(52) U.S. Cl. ............. 365/185.27; 365/201; 365/185.18; 365/227; 365/185.24
(58) Field of Search ............................ 365/185.27, 201, 365/185.18, 227, 185.24

(56) References Cited

U.S. PATENT DOCUMENTS

| | | | | |
|---|---|---|---|---|
| 5,633,825 A | * | 5/1997 | Sakuta et al. | 365/189.09 |
| 5,754,418 A | * | 5/1998 | Park et al. | 363/60 |
| 5,825,705 A | * | 10/1998 | Tsukude et al. | 365/222 |
| 6,031,411 A | * | 2/2000 | Tsay et al. | 327/536 |
| 6,222,781 B1 | * | 4/2001 | Matsumoto et al. | 365/189.09 |
| 6,239,650 B1 | * | 5/2001 | Tsay et al. | 327/536 |
| 6,288,967 B2 | * | 9/2001 | Fujisawa et al. | 365/226 |
| 6,380,798 B1 | * | 4/2002 | Mizuno et al. | 327/534 |
| 6,385,118 B2 | * | 5/2002 | Fujisawa et al. | 365/226 |
| 6,424,585 B1 | * | 7/2002 | Ooishi | 365/226 |
| 6,584,031 B2 | * | 6/2003 | Fujisawa et al. | 365/226 |
| 6,630,857 B2 | * | 10/2003 | Mizuno et al. | 327/534 |
| 6,674,112 B1 | * | 1/2004 | Tadaki et al. | 257/297 |

FOREIGN PATENT DOCUMENTS

JP  2000-173296  6/2000

* cited by examiner

Primary Examiner—Viet Q. Nguyen
(74) Attorney, Agent, or Firm—McDermott Will & Emery LLP

(57) ABSTRACT

At the time of burn-in test, substrate voltages of transistors in a sense amplifier are switched by a PMOS substrate voltage generating portion and an NMOS substrate voltage generating portion. Specifically, the substrate voltage of a P channel MOS transistor is increased during the test than in a normal operation, whereas the substrate voltage of an N channel MOS transistor is decreased during the test than in the normal operation. Consequently, the threshold voltages of the P channel and N channel MOS transistors can be increased upon the test. Leakage currents in the turned-off states can be reduced, and thus, power consumption during the burn-in test can be decreased.

5 Claims, 3 Drawing Sheets

SEMICONDUCTOR MEMORY DEVICE REDUCED IN POWER CONSUMPTION DURING BURN-IN TEST

BACKGROUND OF THE INVENTION

1. Field of the Invention

The present invention relates to semiconductor memory devices, and more particularly to a semiconductor memory device provided with a circuit carrying out a test for reliability evaluation.

2. Description of the Background Art

Generally, periods in which failures occur in a device such as a semiconductor memory device are roughly divided into three periods over time: an initial failure period, a chance failure period, and a wear-out failure period. An initial failure occurs immediately after starting the use of the device, which is attributable to a defect during manufacture of the device. For example, an insufficient margin belongs to this type. The rate of the initial failure decreases sharply with the passage of time. The initial failure period is followed by the chance failure period where a low failure rate continues for a certain long period of time. Near the end of useful life, the device enters the wear-out failure period where the failure rate suddenly increases. It is desirable that a device is used within the chance failure period which corresponds to the useful life period. In order to increase reliability of a device, the chance failure period should last for a long period of time with a constant, low failure rate.

On the other hand, in order to eliminate the initial failure in advance, there is a need to perform accelerated operation aging on devices for a certain period of time, for screening to reject defective products. Such screening will be performed effectively within a short period of time if the initial failure rate decreases rapidly to make the device promptly enter the chance failure period. One of such screening methods generally employed at present is a high-temperature operation test (burn-in test), which employs real devices to directly evaluate dielectric films of transistors and others. With this method, stress of high temperature and high field is applied, so that every cause of failure including short circuit between interconnections can be elicited with accelerated speed.

In the burn-in test, however, stress of high field, i.e., a high voltage should be applied to devices, resulting in power consumption of a considerable amount during the test. In this regard, Japanese Patent Laying-Open No. 2000-173296, for example, discloses a method for decreasing power consumption during the burn-in test by making its inspection step short.

Such a method, however, requires special devices or complicated control for shortening the inspection step.

Moreover, in accordance with a recent demand for devices of higher speed and lower voltage, a transistor having a low threshold voltage (hereinafter, also referred to as the "Low-Vth transistor") has generally been used as a circuit element. Such a Low-Vth transistor suffers a leakage current when turned off, due to its low threshold voltage. In particular, the leakage current would further increase when stress of high field is applied as in the case of the above-described burn-in test, than in a normal operation.

SUMMARY OF THE INVENTION

An object of the present invention is to provide a semiconductor memory device of a simple configuration which permits reduction of consumed power during a burn-in test.

A semiconductor memory device according to the present invention includes a plurality of memory cells arranged in rows and columns, a plurality of bit lines provided corresponding to the respective memory cell columns, a peripheral circuit, and a substrate voltage control circuit. Upon a test, a burn-in voltage that is higher than a voltage in a normal operation is supplied to at least one of the plurality of bit lines. The peripheral circuit has at least one field effect transistor that is electrically coupled to at least one bit line and turns off at the time of the test. The substrate voltage control circuit supplies a first substrate voltage to the field effect transistor in the peripheral circuit in the normal operation, and supplies a second substrate voltage to the field effect transistor at the time of the test.

As described above, according to the present invention, the substrate voltage control circuit, in control of the substrate voltage of the field effect transistor turning off during a test, differentiates the substrate voltage during the test from that in a normal operation. This allows changing of the threshold voltage of the field effect transistor in a turned-off state. Accordingly, it is possible to reduce a leakage current of the field effect transistor in the turned-off state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
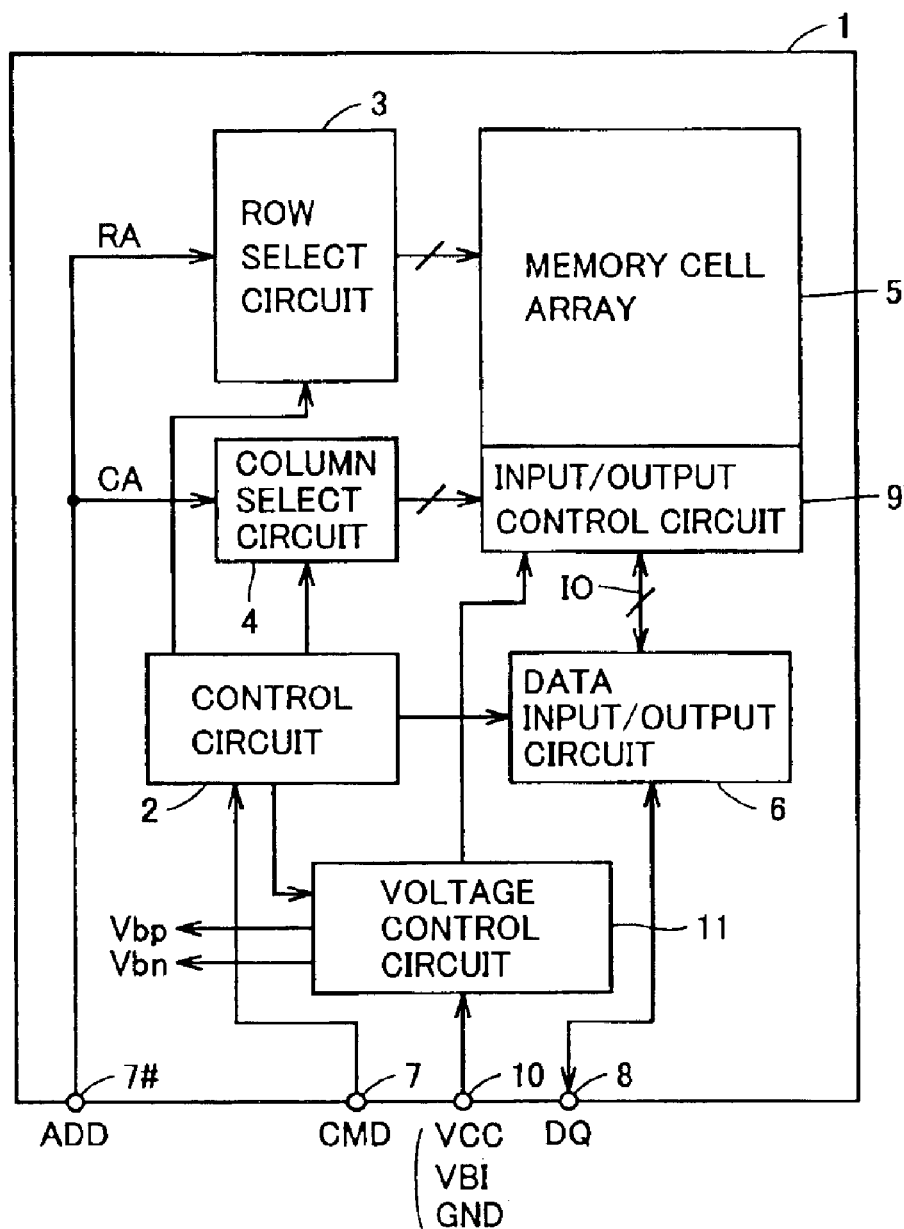
FIG. 1 shows an overall configuration of a semiconductor memory device according to an embodiment of the present invention.

An embodiment of the present invention is described in detail with reference to the drawings. In the drawings, the same or corresponding portions are denoted by the same reference characters, and description thereof is not repeated.

Referring to FIG. 1, the semiconductor memory device 1 according to an embodiment of the present invention includes: a control circuit 2 which controls overall internal operations of semiconductor memory device 1 for carrying out various operations in response to a command CMD; a memory cell array 5 having a plurality of memory cells arranged in rows and columns; a row select circuit 3 which decodes a row address RA of an address signal ADD to execute selection of a memory cell row; a column select circuit 4 which decodes a column address CA of address signal ADD to execute selection of a memory cell column; an input/output control circuit 9 which connects an internal interconnection of memory cell array 5 with a data signal line IO based on a column select result of column select circuit 4; a data input/output circuit 6 which transmits data DQ between data signal line IO and a data input/output terminal 8; and a voltage control circuit 11 which receives, from a power supply terminal 10, a power supply voltage VCC supplied in a normal operation, a ground voltage GND, and a power supply voltage VBI supplied during a test, and provides internal circuits with a necessary voltage.

Semiconductor memory device 1 further includes an address input terminal 7# which receives address signal ADD, and a control signal terminal 7 which receives control signals such as command CMD and others.

Hereinafter, binary states of high voltage and low voltage of signals, signal lines and data are also referred to as an "H" level and an "L" level, respectively.

Figure 2:
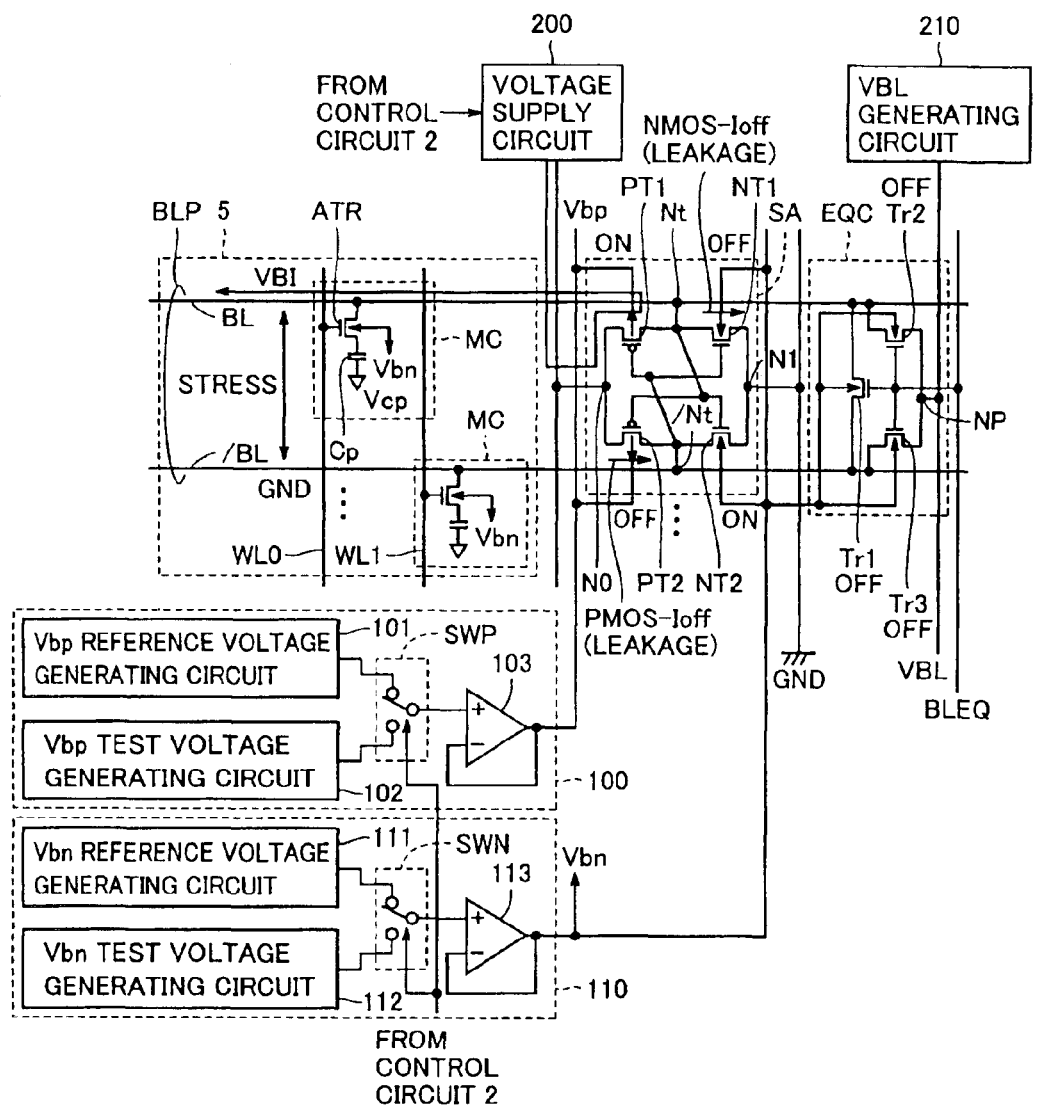
FIG. 2 schematically shows a memory cell array and its peripheral circuits according to the embodiment of the present invention.

Referring to FIG. 2, memory cell array 5 according to the present embodiment has memory cells MC integrally arranged in rows and columns. Here, such rows and columns of a plurality of memory cells MC in memory cell array 5 are also referred to as memory cell rows and memory cell columns. In memory cell array 5, a bit line pair BLP is provided for every two neighboring memory cell columns. Bit line pair BLP includes bit lines BL and /BL, which are provided corresponding to one and the other of the two memory cell columns, respectively. Herein, the symbol "/" represents inversion, negation, complementarity or the like.

Memory cell MC includes a capacitor Cp for use in retaining charges for data storage, and an access element ATR for electrically coupling capacitor Cp with bit line BL (/BL). Capacitor Cp is electrically coupled to a cell plate voltage Vcp that is generated in voltage control circuit 11.

A plurality of word lines WL are provided corresponding to the respective memory cell rows. Even-numbered word lines WL are provided corresponding to bit lines BL, while odd-numbered word lines WL are provided corresponding to complementary bit lines /BL.

In FIG. 2, by way of example, access element ATR of memory cell MC corresponding to bit line BL is electrically coupled to word line WL0, and access element ATR of memory cell MC corresponding to bit line /BL is electrically coupled to word line WL1. Word line WL collectively represents a plurality of word lines.

A sense amplifier SA, driven at the time of data read or the like, is provided for each bit line pair BLP. It is assumed that sense amplifier SA is included in input/output control circuit 9.

Sense amplifier SA includes transistors PT1, PT2 and transistors NT1, NT2. Low-Vth transistors as described above are used for sense amplifier SA, since a high-speed amplifying operation is expected. Transistor PT1 is arranged between a power supply node N0 and an output node Nt, and has its gate electrically coupled to an output node /Nt. Transistor PT2 is arranged between power supply node N0 and output node /Nt, and has its gate electrically coupled to output node Nt. Transistor NT1 is arranged between a node N1, which is supplied with ground voltage GND, and output node Nt, and has its gate electrically coupled to output node /Nt. Transistor NT2 is arranged between node N1 receiving ground voltage GND and output node /Nt, and has its gate electrically coupled to output node Nt.

This sense amplifier SA is of a so-called cross-coupled type, and amplifies a voltage difference between output nodes Nt and /Nt. That is, it sets one and the other of output nodes Nt and /Nt to an "H" level (power supply voltage VCC level) and an "L" level (ground voltage GND level). Power supply node N0 is electrically coupled to a voltage supply circuit 200.

Voltage supply circuit 200 supplies power supply voltages corresponding respectively to normal and testing operations to power supply node N0, based on an operation designation from control circuit 2. More specifically, it supplies power supply node N0 with power supply voltage VCC in a normal operation and power supply voltage VBI higher than power supply voltage VCC during a test.

Further provided are a precharge circuit EQC which equalizes bit line pair BLP and precharges the same to a prescribed level, and a VBL generating circuit 210 which supplies a precharge voltage VBL (=VCC/2).

Precharge circuit EQC includes transistors Tr1–Tr3. Transistor Tr1 is arranged between bit lines BL and /BL, and has its gate electrically coupled to a signal line transmitting a control signal BLEQ. Transistor Tr2 is arranged between bit line BL and a connect node NP, and has its gate electrically coupled to the signal line transmitting control signal BLEQ. Transistor Tr3 is arranged between bit line /BL and connect node NP, and has its gate electrically coupled to the signal line transmitting control signal BLEQ. Connect node NP is electrically coupled to VBL generating circuit 210. Control signal BLEQ ("H" level) is generated by control circuit 2 before data read.

The operation of precharge circuit EQC is now described. Precharge circuit EQC equalizes and precharges bit line pair BLP to a prescribed level at the time of data read and others. More specifically, control signal BLEQ is set to an "H" level by control circuit 2 before data read. Correspondingly, transistors Tr1–Tr3 all turn on, and bit lines BL and /BL are electrically coupled. Further, precharge voltage VBL (=Vcc/2) is supplied from VBL generating circuit 210, and bit line pair BLP is precharged to a prescribed level.

Voltage control circuit 11 according to the present embodiment includes a PMOS substrate voltage generating portion 100 which generates a substrate voltage Vbp of each P channel MOS transistor, and an NMOS substrate voltage generating portion 110 which generates a substrate voltage Vbn of each N channel MOS transistor.

PMOS substrate voltage generating portion 100 includes a Vbp reference voltage generating circuit 101 which generates a substrate voltage of each P channel MOS transistor in a normal operation, a Vbp test voltage generating circuit 102 which generates a substrate voltage of each P channel MOS transistor at the time of burn-in test, a switch SWP for switching the substrate voltage to be supplied to each P channel MOS transistor, and an operational amplifier 103 which receives a voltage output from switch SWP and outputs the same to the substrate of each P channel MOS transistor.

Operational amplifier 103 is of a so-called voltage follower type, which functions as a buffer circuit for a substrate voltage output from Vbp reference voltage generating circuit 101 or Vbp test voltage generating circuit 102 in this example.

NMOS substrate voltage generating portion 110 includes a Vbn reference voltage generating circuit 111 which generates a substrate voltage of each N channel MOS transistor in a normal operation, a Vbn test voltage generating circuit 112 which generates a substrate voltage of each N channel MOS transistor at the time of burn-in test, a switch SWN for switching the substrate voltage to be supplied to each N channel MOS transistor, and an operational amplifier 113 which receives a voltage output from switch SWN and outputs the same to the substrate of each N channel MOS transistor. As described above, operational amplifier 113 serves as a buffer circuit for the substrate voltages generated by Vbn reference voltage generating circuit 111 and Vbn test voltage generating circuit 112.

In the present embodiment, by way of example, Vbp reference voltage generating circuit 101 generates a substrate voltage of 1.7 V, and Vbp test voltage generating circuit 102 generates a substrate voltage of 3.7 V. Vbn reference voltage generating circuit 111 generates a substrate voltage of −0.7 V, and Vbn test voltage generating circuit 112 generates a substrate voltage of 2.7 V.

The operations of the memory array and the peripheral circuits according to the present embodiment during a burn-in test are now described.

In the present embodiment, the case where sense amplifier SA is employed at the time of burn-in test to apply voltages to bit lines BL, /BL is explained by way of example. That is, a high voltage and a low voltage (ground voltage GND) from voltage supply circuit 200 are applied to bit lines BL, /BL.

More specifically, in order to make sense amplifier SA operate, prescribed data write is performed on a prescribed memory cell, and data read of the prescribed memory cell is executed.

Firstly, data "1" is written to memory cell MC corresponding to word line WL0.

More specifically, data input/output circuit 6, in response to an input of external data DQ ("1"), transmits write data to data signal line IO. Input/output control circuit 9 transmits the write data having been transmitted to data signal line IO to bit line BL and complementary bit line/BL of bit line pair BLP selected based on a column select result of column select circuit 4.

In this example, bit lines BL, /BL are set to an "H" level and an "L" level, respectively. Next, row select circuit 3 selects one of a plurality of word lines WL based on a row select result. It is assumed in this example that word line WL0 is activated. Correspondingly, access element ATR of memory cell MC corresponding to word line WL0 turns on, and capacitor Cp and bit line BL are electrically coupled to each other. Consequently, capacitor Cp is charged, and data "1" can be written into memory cell MC corresponding to word line WL0. Although the charged and uncharged states of capacitor Cp have been explained correlated to data "1" and "0", respectively, inverted data "0" and "1" may also be correlated thereto.

Next, data read of memory cell MC corresponding to word line WL0 is executed. Precharging of bit line pair BLP before data read as described above is now explained. Control signal BLEQ is set to an "H" level. Correspondingly thereto, bit line pair BLP is equalized and set to a voltage VCC/2 level. Next, one of a plurality of word lines WL is selected based on a row select result of row select circuit 3. It is assumed in this example that word line WL0 is activated. Thus, capacitor Cp and bit line BL are electrically coupled to each other, and a voltage level of output node Nt rises because of capacitor Cp having charges.

Consequently, in sense amplifier SA, output node Nt level becomes higher than output node /Nt level, and thus, transistors PT1 and NT2 turn on, making output node Nt and voltage supply circuit 200 electrically coupled to each other. In the present embodiment, at the time of burn-in test, power supply voltage VBI that is greater than power supply voltage VCC in a normal operation is supplied to bit line BL. On the other hand, output node /Nt and ground voltage GND are electrically coupled to each other, and ground voltage GND is supplied to complementary bit line /BL.

Accordingly, it is possible to apply high-field stresses to bit lines BL,/BL at the time of burn-in test. At this time, in sense amplifier SA, transistors NT1 and PT2 are off, and thus, a leakage current at the time of turn-off occurs. Specifically, a leakage current NMOS-Ioff flows through transistor NT1, and a leakage current PMOS-Ioff flows through transistor PT2.

Now, an on current upon turn-on and a leakage current upon turn-off of an N channel MOS transistor according to the present embodiment are described with reference to FIG. 3.

The vertical axis represents a current amount Ids (A: ampere). The horizontal axis represents a voltage level (V: volt).

Figure 3:
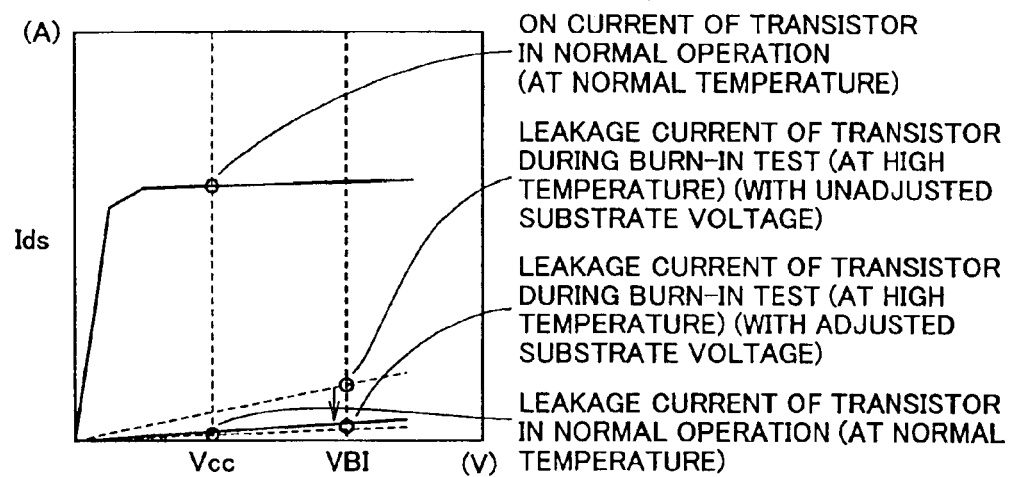
FIG. 3 illustrates an on current upon turn-on and a leakage current upon turn-off of an N channel MOS transistor according to the embodiment of the present invention.

As shown by solid lines in FIG. 3, in a normal operation, the on current of the transistor flows in a prescribed value upon a rise of the voltage level, while the leakage current increases at a constant rate with the rise of the voltage level.

At the time of burn-in test, as shown by broken lines in FIG. 3, the leakage current of the transistor increases at a rate greater than in the normal operation, attributable to the fact that it operates at a high temperature, supplied with a high voltage. Thus, the leakage current of the transistor in accordance with power supply voltage VBI supplied at the time of burn-in test is not negligible.

In the present embodiment, the voltage level of the substrate voltage being supplied to each transistor is switched by switching operations of switches SWP and SWN in accordance with an operation designation from control circuit 2 at the time of burn-in test. More specifically, at the time of burn-in test, switch SWP electrically connects Vbp test voltage generating circuit 102 with operational amplifier 103, and switch SWN electrically connects Vbn test voltage generating circuit 112 with operational amplifier 113.

At the time of burn-in test, Vbn test voltage generating circuit 112 is used to decrease the substrate voltage of N channel MOS transistor than in a normal operation. Thus, the threshold voltage of the N channel MOS transistor changes in accordance with a substrate bias which corresponds to an absolute value of the substrate voltage of the N channel MOS transistor. More specifically, a depletion layer in the substrate expands as the substrate bias increases, resulting in an increase of polar donors. As such, additional gate electric field becomes necessary to induce channel charges of the same polarity, so that the threshold voltage can be increased.

Thus, by increasing the threshold voltage of each N channel MOS transistor at the time of burn-in test, the leakage current of the transistor in a turned-off state can be decreased, as shown by the broken line in FIG. 3. Accordingly, it is possible to reduce the leakage current of transistor NT1 in sense amplifier SA.

As to a P channel MOS transistor, Vbp test voltage generating circuit 102 is used to provide the P channel MOS transistor with a substrate voltage that is greater than in a normal operation. Correspondingly, a substrate bias can be increased, as in the case of the N channel MOS transistor described above, and thus, the threshold voltage can be increased.

Consequently, at the time of burn-in test, it is possible to increase the threshold voltage of each P channel MOS transistor, and thus, to reduce the leakage current of the transistor in the turned-off state. Specifically, the leakage current of transistor PT2 in sense amplifier SA can be reduced. Accordingly, it is possible to reduce power consumption at the time of burn-in test, while guaranteeing the high-speed operability of sense amplifier SA formed of the Low-Vth transistors.

Similarly, the leakage current can be reduced in a precharge circuit PRC which precharges bit line pair BLP.

More specifically, at the time of test, control signal BLEQ is set to an "L" level, and all the transistors Tr1–Tr3 are set to the turned-off state.

Thus, at the time of burn-in test, when stress is applied between bit lines BL and /BL, a leakage current would occur in transistor Tr1 within precharge circuit EQC. The leakage current would also occur in each of transistors TR2 and TR3, since stress is applied between the source and the drain.

Thus, as described above, the substrate voltage of each transistor Tr1–Tr3 is switched to the substrate voltage for the burn-in test that is supplied from Vbn test voltage generating circuit 112.

Accordingly, it is possible to reduce the leakage currents in transistors Tr1–Tr3, in the same manner as described above.

Further, in the present embodiment, the substrate voltage of access element ATR in a memory cell is also switched at the time of burn-in test, so that the leakage current can be reduced again as in the case described above. Although the configuration for decreasing the transistor leakage current in sense amplifier SA, precharge circuit PRC and access element ATR has been described above, the same applies to transistors in other peripheral circuits.

The configuration according to the present embodiment is advantageous in that a simple configuration of switching the substrate voltages of N channel MOS transistors and P channel MOS transistors to the ones for burn-in test at the time of burn-in test can increase the threshold voltages of the N channel MOS transistors and the P channel MOS transistors. Accordingly, it is possible to reduce the leakage current of a transistor in a turned-off state, and to readily decrease the overall power consumption at the time of burn-in test without complicated control.

In the present example, the configuration where memory cell array 5 has bit lines BL, /BL complementary to each other has been described. Not limited thereto, a configuration where only a bit line BL, not accompanied by complementary bit line /BL, is arranged corresponding to a respective memory cell column is also applicable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory cells arranged in rows and columns;

a plurality of bit lines provided corresponding to the memory cell columns, respectively, at least one of said plurality of bit lines being supplied with a burn-in voltage during a test that is greater than a voltage in a normal operation;

a peripheral circuit including at least one field effect transistor that is electrically coupled to said at least one bit line and turns off in said test; and a substrate voltage control circuit supplying a first substrate voltage to said field effect transistor in said peripheral circuit in said normal operation and supplying a second substrate voltage to said field effect transistor during said test.

2. The semiconductor memory device according to claim 1, wherein said peripheral circuit includes a sense amplifier for reading, at the time of data read, stored data in one of said plurality of memory cells selected as a data read target, and said field effect transistor corresponds to at least one of transistors constituting said sense amplifier.

3. The semiconductor memory device according to claim 1, wherein said peripheral circuit includes a precharge circuit turning on before data read to electrically couple at least one of said plurality of bit lines to a prescribed voltage for precharge, and said field effect transistor corresponds to at least one of transistors constituting said precharge circuit.

4. The semiconductor memory device according to claim 1, wherein said substrate voltage control circuit includes a first substrate voltage generating circuit generating said first substrate voltage, a second substrate voltage generating circuit generating said second substrate voltage, and a switching circuit, in response to a test designation, switching said first and second substrate voltage generating circuits to output said second substrate voltage to said field effect transistor during said test.

5. The semiconductor memory device according to claim 1, wherein said field effect transistor corresponds to one of field effect transistors of first and second conductivity types, and said substrate voltage control circuit increases said first substrate voltage of the field effect transistor of said first conductivity type to a level greater than said second substrate voltage, and decreases said first substrate voltage of the field effect transistor of said second conductivity type to a level lower than said second substrate voltage.

\* \* \* \* \*